(12) United States Patent
Regnier

(10) Patent No.: US 9,807,883 B2
(45) Date of Patent: Oct. 31, 2017

(54) CABLE TERMINATION SYSTEM

(71) Applicant: MOLEX INCORPORATED, Lisle, IL (US)

(72) Inventor: Kent E. Regnier, Lombard, IL (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/300,053

(22) PCT Filed: Apr. 2, 2015

(86) PCT No.: PCT/US2015/023982
§ 371 (c)(1),
(2) Date: Sep. 28, 2016

(87) PCT Pub. No.: WO2015/153830
PCT Pub. Date: Oct. 8, 2015

(65) Prior Publication Data
US 2017/0181285 A1    Jun. 22, 2017

Related U.S. Application Data

(60) Provisional application No. 61/974,251, filed on Apr. 2, 2014.

(51) Int. Cl.
*H05K 1/11*    (2006.01)
*H05K 1/18*    (2006.01)

(52) U.S. Cl.
CPC ............. *H05K 1/184* (2013.01); *H05K 1/111* (2013.01); *H05K 1/115* (2013.01); *H05K 1/181* (2013.01)

(58) Field of Classification Search
CPC .......... H05K 1/11; H05K 1/111; H05K 1/112; H05K 1/113; H05K 1/114; H05K 1/115; H05K 1/116; H05K 1/181; H05K 1/184
See application file for complete search history.

(56) References Cited

U.S. PATENT DOCUMENTS

| | | |
|---|---|---|
| 6,380,485 B1 | 4/2002 | Beaman et al. |
| 6,921,293 B2 | 7/2005 | Takada et al. |
| 2011/0250791 A1 | 10/2011 | Straka et al. |
| 2013/0072041 A1 | 3/2013 | Nonen et al. |

FOREIGN PATENT DOCUMENTS

| | | |
|---|---|---|
| KR | 2009-0004203 A | 1/2009 |
| TW | 537507 U | 11/2003 |
| TW | 201218548 A | 1/2012 |

*Primary Examiner* — Jeremy C Norris
(74) *Attorney, Agent, or Firm* — Jeffrey K. Jacobs

(57) ABSTRACT

A cable termination is disclosed that includes a cable with a first and a second insulated conductor positioned in a shield, the cable further including a drain wire. The cable is mounted on a circuit board that includes a first pad and a second pad that are respectively soldered to the first and second conductors. A ground via is positioned in front and between the first and second pads and the drain wire is inserted into and soldered to the ground via.

10 Claims, 9 Drawing Sheets

CABLE TERMINATION SYSTEM

RELATED APPLICATIONS

This application claims priority to International Application No. PCT/US2015/023982, filed Apr. 2, 2015, which claims priority to U.S. Provisional Application No. 61/974,251, filed Apr. 2, 2014, both of which are incorporated herein by reference in their entirety.

TECHNICAL FIELD

This disclosure relates to field of connectors, more specifically to a method of terminating cables in a plug connector.

DESCRIPTION OF RELATED ART

Cable connectors are becoming increasingly important in high performance computing solutions. As data rates increase, the practice of using the circuit board to deliver signals from an integrated circuit (IC) in one location to another location on the circuit board is becoming more challenging due to the losses inherent in sending signals through commonly available circuit board materials. As this loss is a result of the material properties of the circuit board (and thus requires expensive materials to provide a noticeable improvement), it has become more important to reduce other losses in the system that previously were considered minor. Naturally, one place to look when considering how to reduce losses is any transition. As known, transitions between areas tend to result in impedance discontinuities and these discontinuities at sufficiently high signaling frequencies can result in energy reflection that both increases insertion loss and also tends to result in increased cross-talk.

Cable connectors naturally have a transition because they have terminals with contacts in the connector portion and conductors in the cable portion. Therefore, while the cable itself might offer low loss (on the order of less than 5 dB of loss per meter), certain individuals would appreciate further improvements in cable assembly that could offer an improved transition between the cable and the contacts.

SUMMARY

A cable connector includes a circuit board with a first trace and a second trace and a ground via that is arranged between the first and second traces but in an offset manner. A cable is mounted to the circuit board. The cable includes a shield wrapped around a first conductor and a second conductor. The first and second conductors are each surrounded by an insulative layer that extends in a cylindrical manner along a length of the conductors so as to form a pair of insulated conductors. A drain wire is positioned just inside the shield and is adjacent the pair of insulated conductors. The first conductor is soldered to the first trace. The second conductor is soldered to the second trace. The drain cable is soldered to the ground via. If desired, the drain wire can pass between the first and second conductor before the solder connection to the ground via.

BRIEF DESCRIPTION OF THE DRAWINGS

The present invention is illustrated by way of example and not limited in the accompanying figures in which like reference numerals indicate similar elements and in which.

DETAILED DESCRIPTION

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

Figure 1:
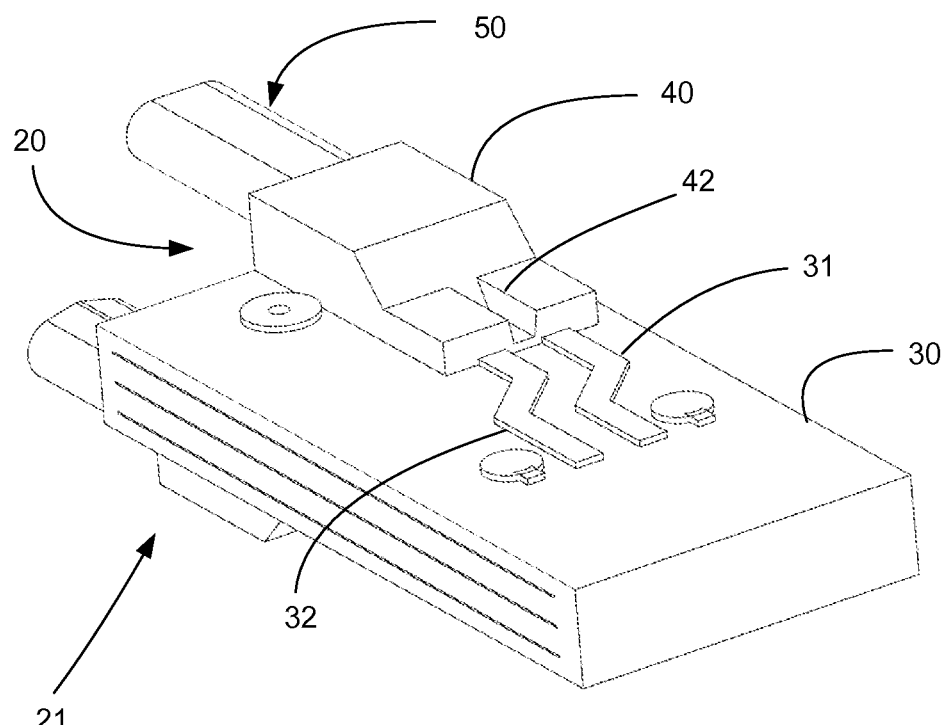
FIG. 1 illustrates a perspective view of an embodiment of a cable termination to a circuit board.
Figure 2:
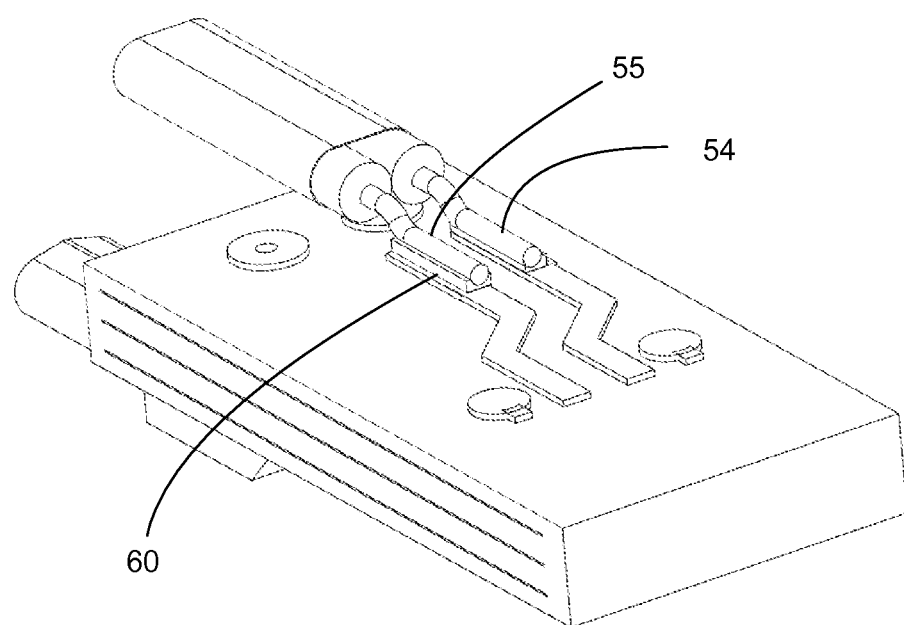
FIG. 2 illustrates a perspective simplified view of the embodiment depicted in FIG. 1.
Figure 3:
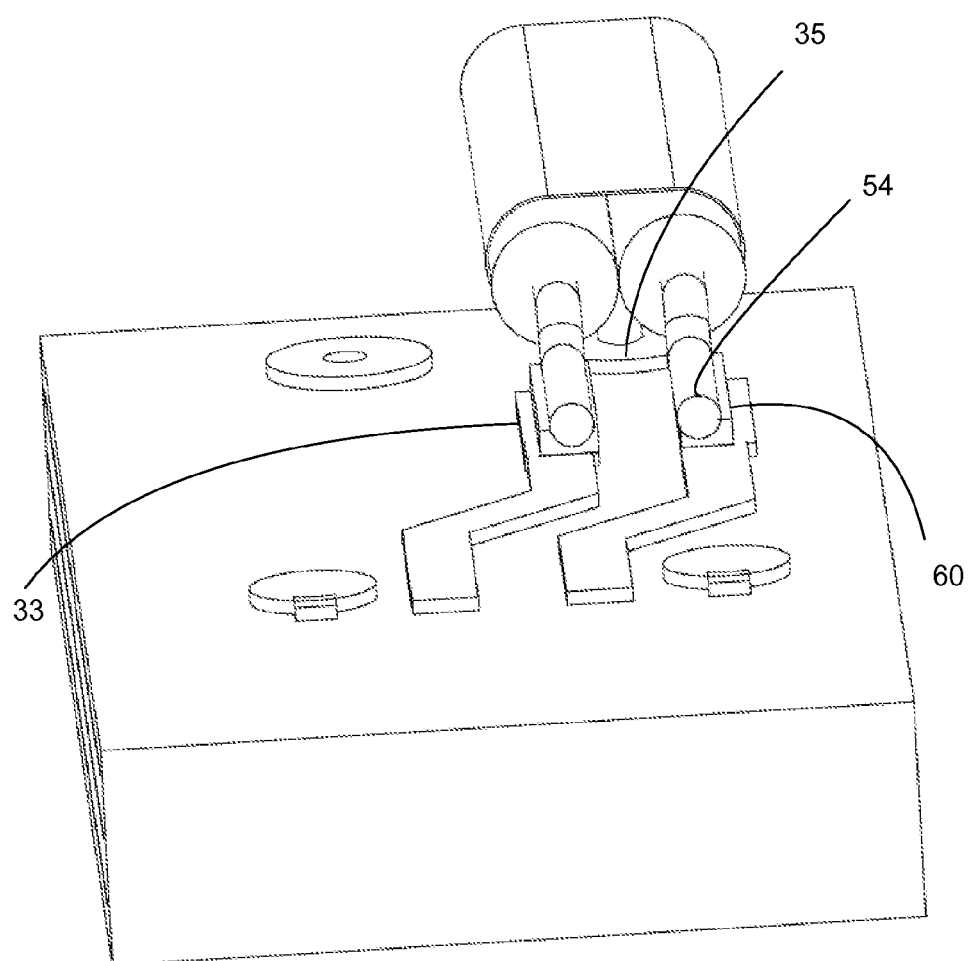
FIG. 3 illustrates another perspective view of the embodiment depicted in FIG. 2.
Figure 4:
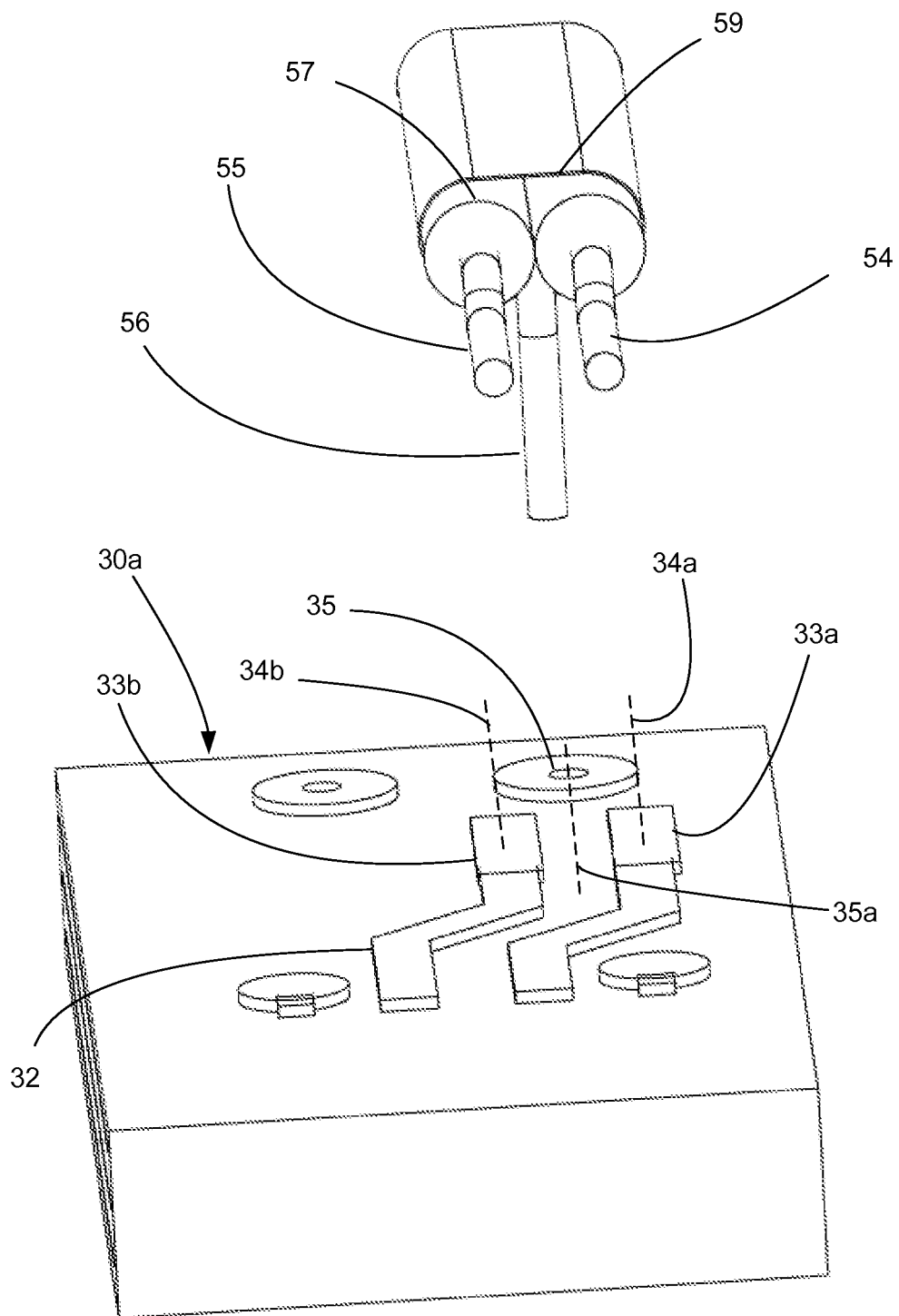
FIG. 4 illustrates a partially exploded perspective view of the embodiment depicted in FIG. 3.
Figure 5:
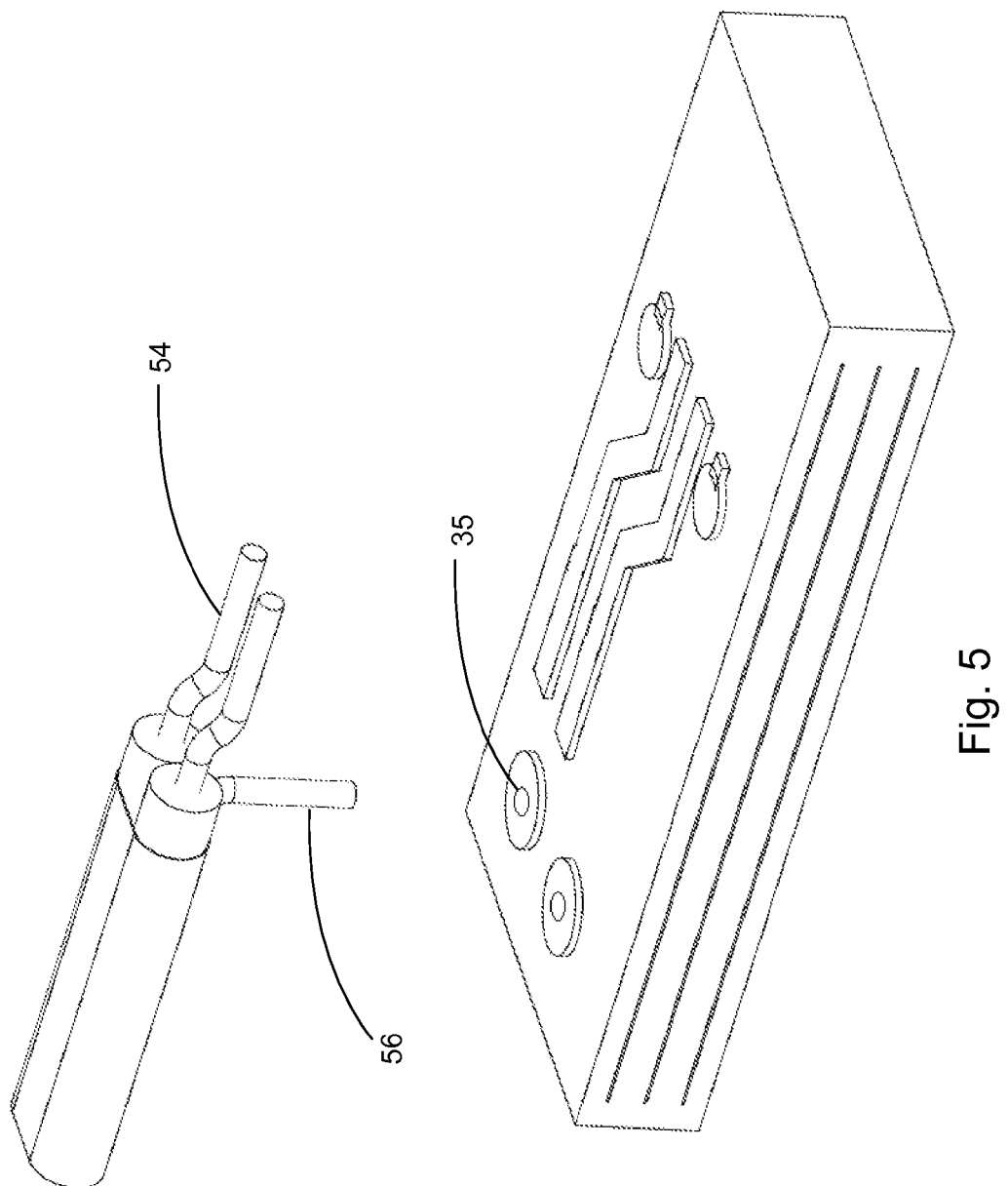
FIG. 5 illustrates another perspective view of the embodiment depicted in FIG. 4.
Figure 6:
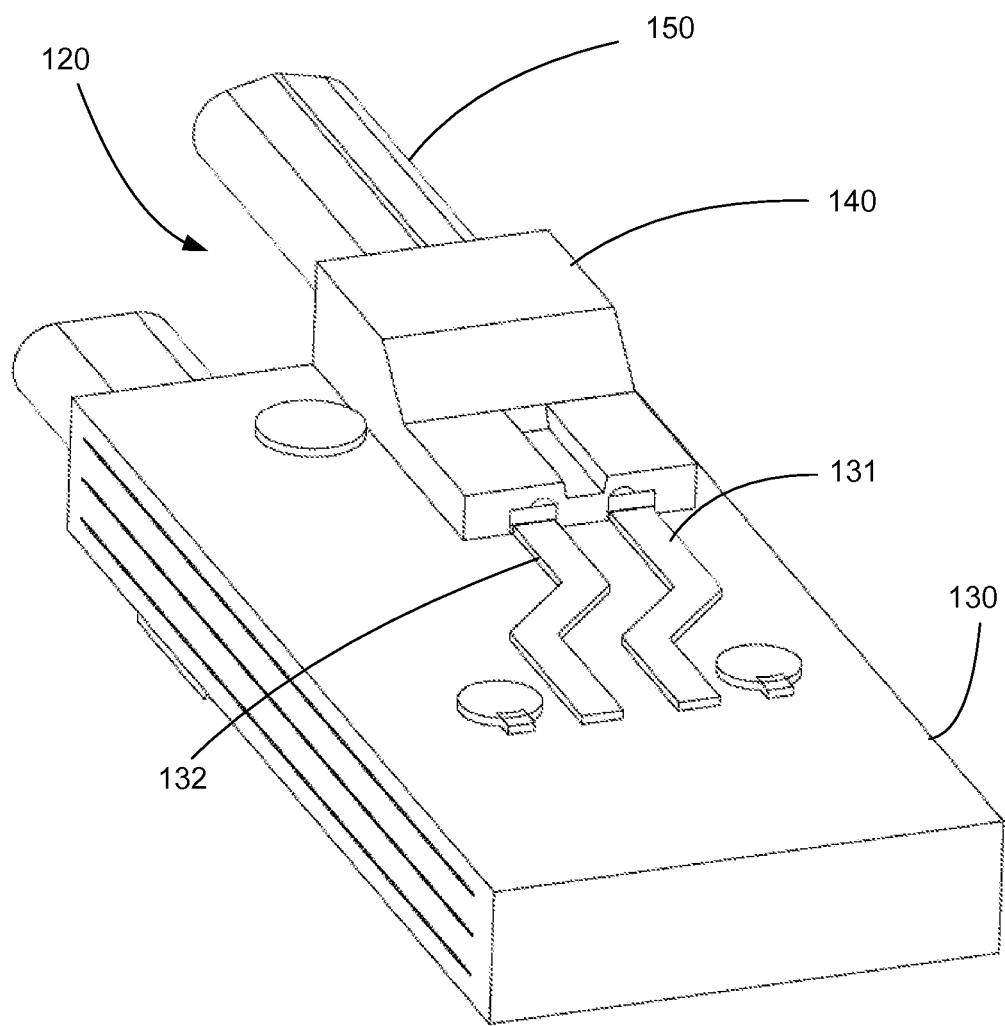
FIG. 6 illustrates a perspective view of another embodiment of a cable termination on a first side of a circuit board.
Figure 7:
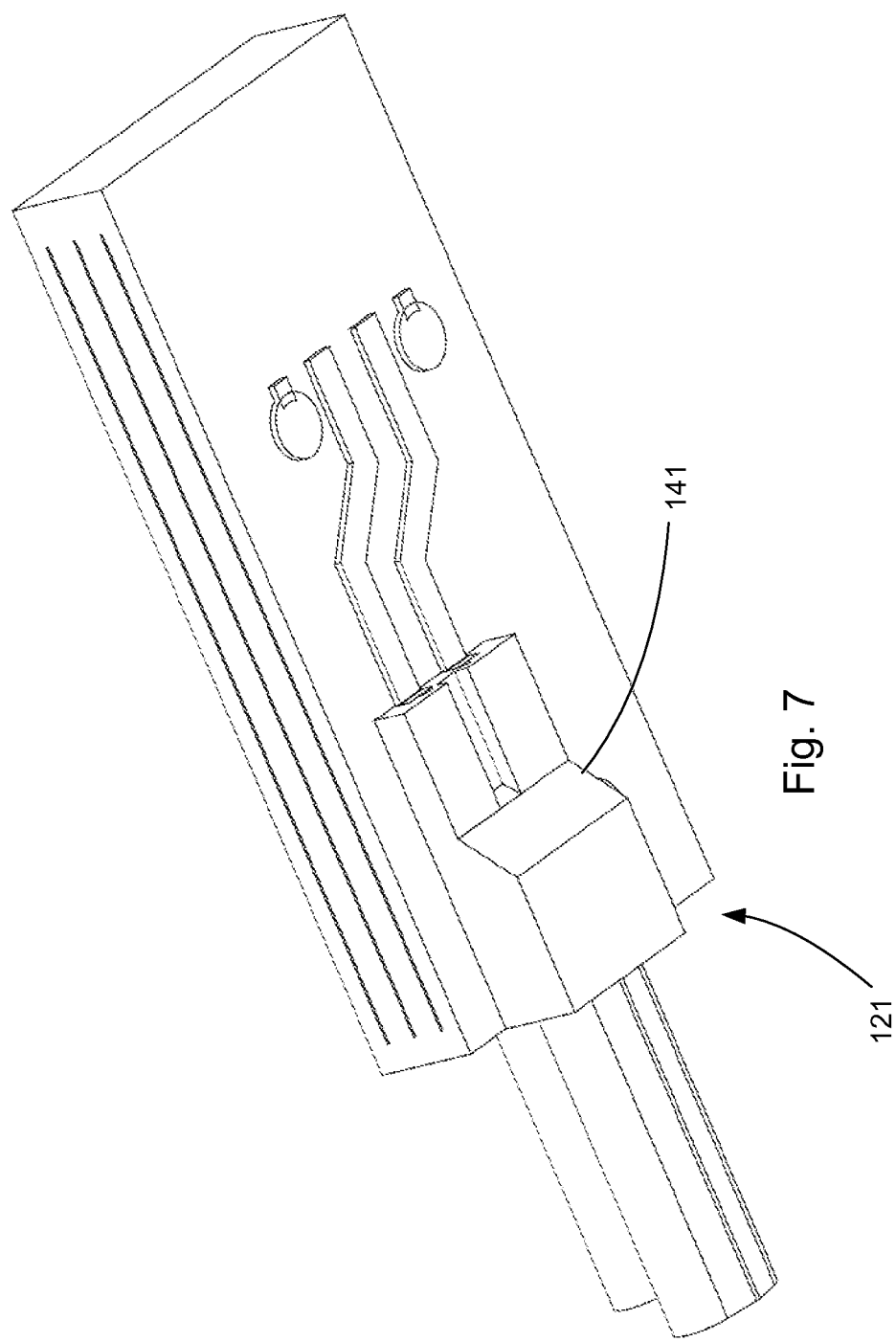
FIG. 7 illustrates a perspective view of a cable termination on a second side of the circuit board depicted in FIG. 6.
Figure 8:
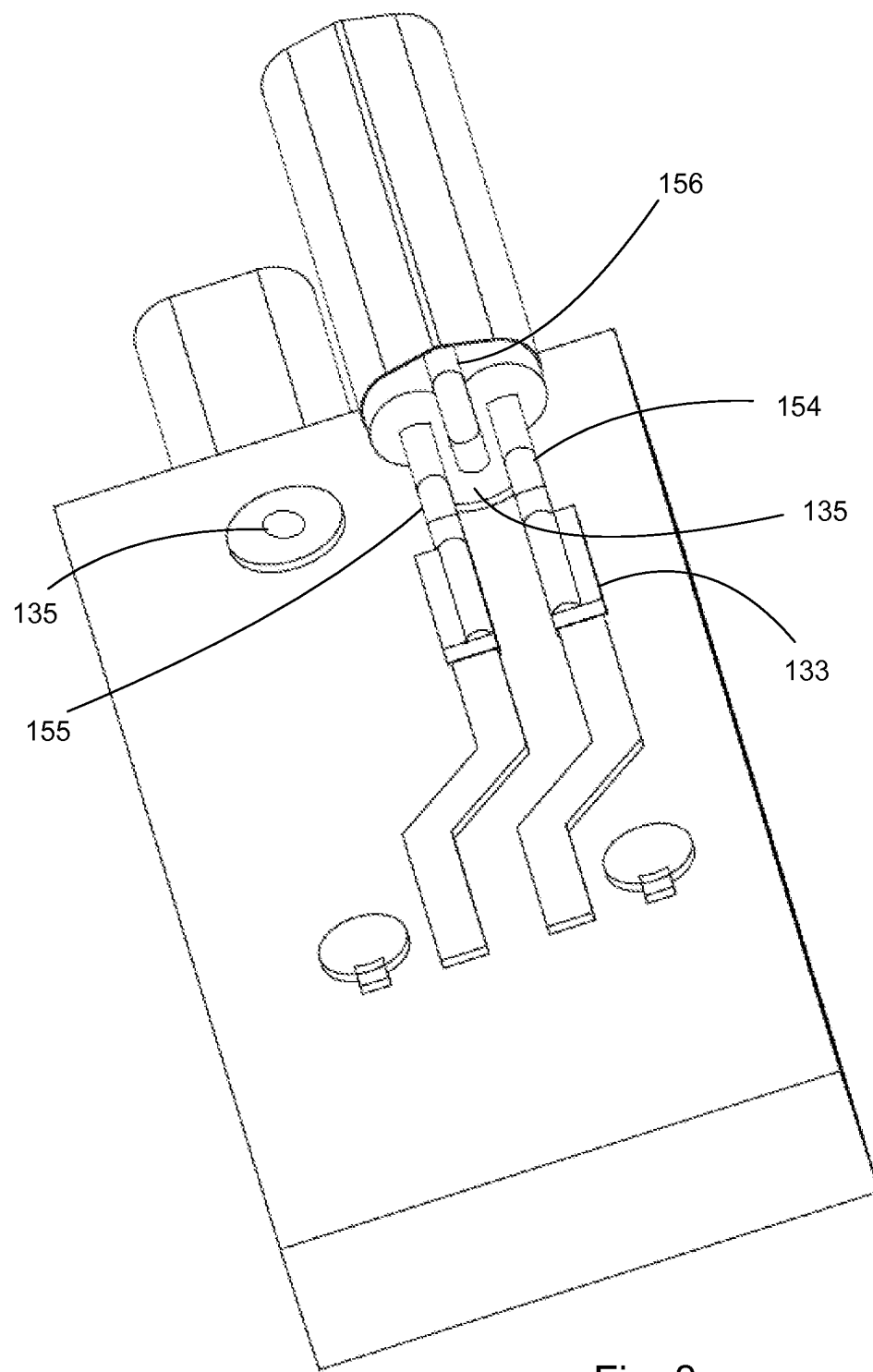
FIG. 8 illustrates a simplified perspective view of the embodiment depicted in FIG. 6.
Figure 9:
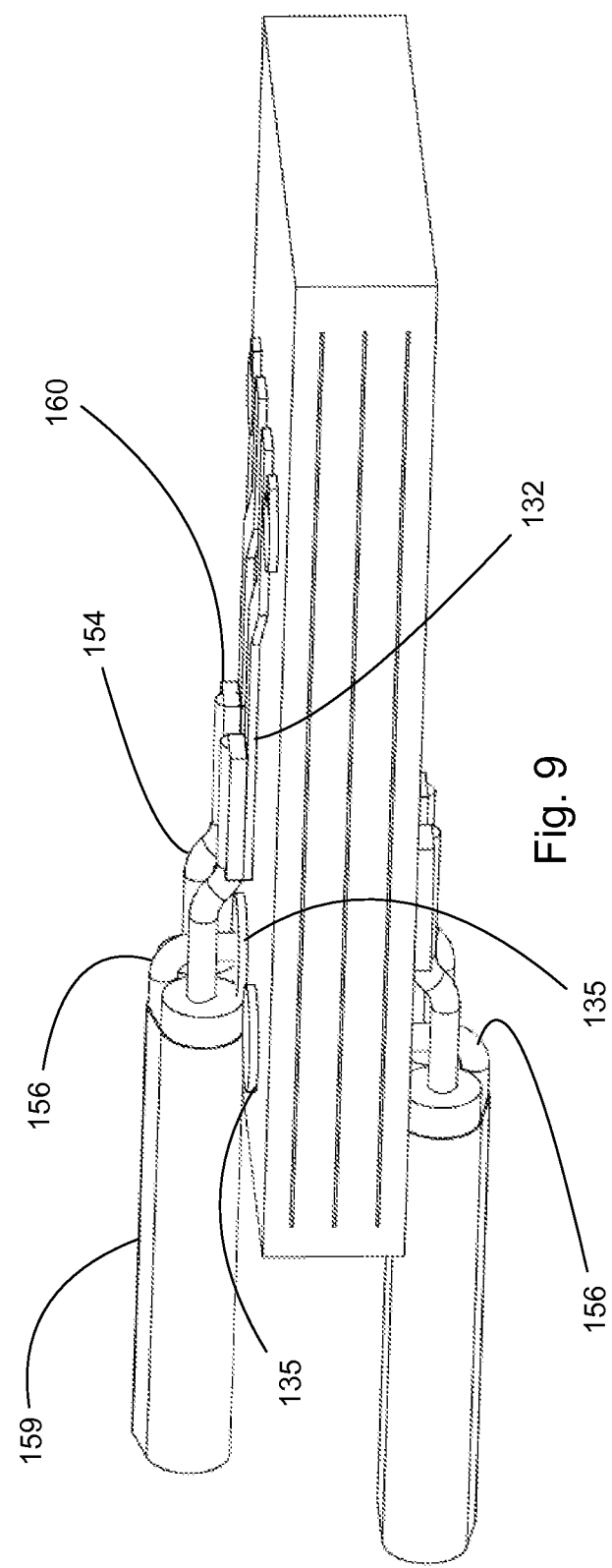
FIG. 9 illustrates another perspective view of the embodiment depicted in FIG. 6.
Figure 10:
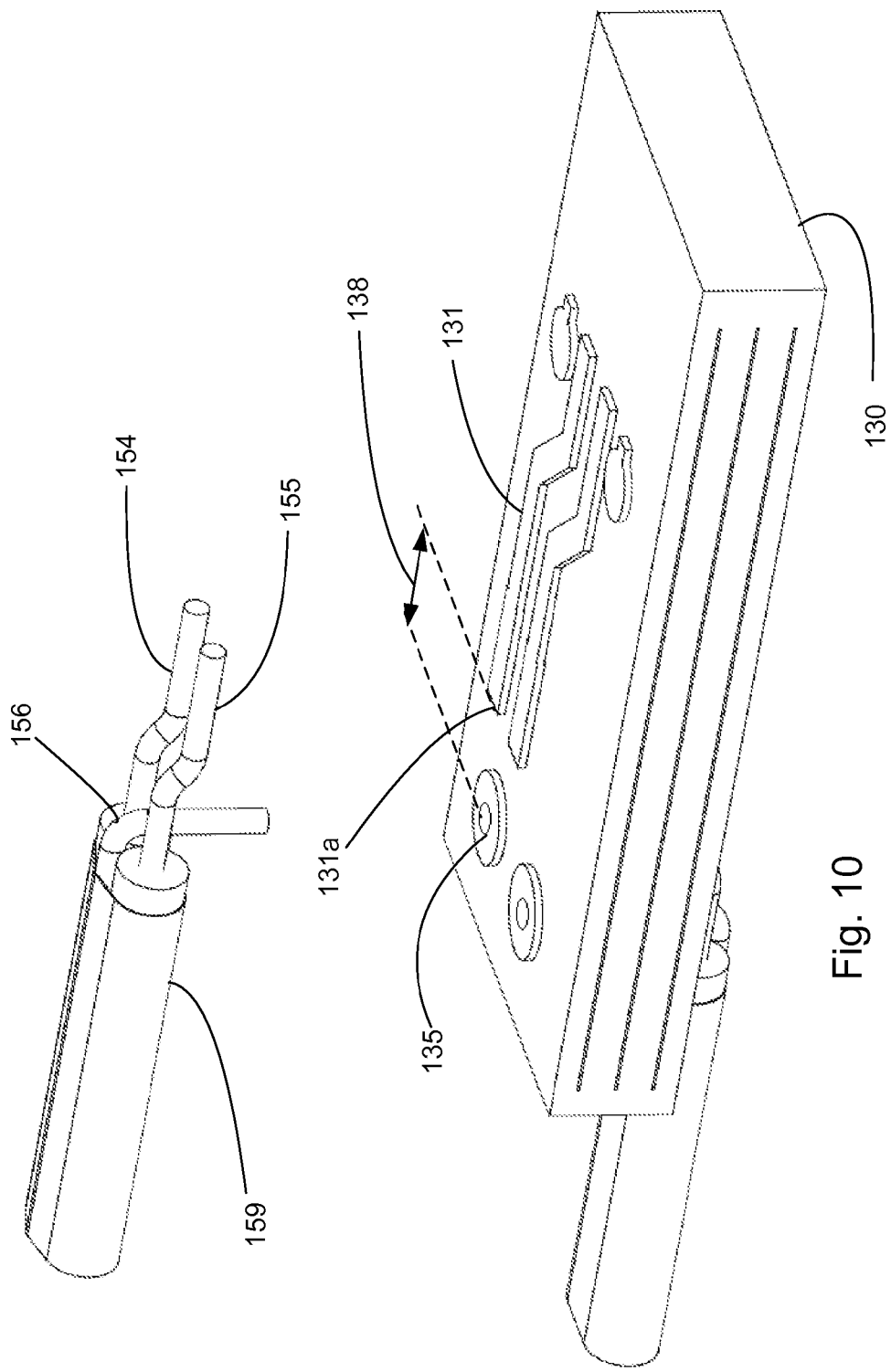
FIG. 10 illustrates a partially exploded perspective view of the embodiment depicted in FIG. 9.

As is known, a cable assembly includes a cable, a plug connector and a connection between the cable and the plug connector (e.g., a cable termination). FIGS. 1-10 illustrate features that can be used to provide an enhanced cable termination. It should be noted that the FIGS. 1-10 illustrate different termination configurations and are not intended to be limited with respect to the rest of the design of the supporting circuit card (or the resulting connector). Thus the term circuit board includes convention circuit boards as well as other substrates with traces and vias.

One thing that has been determined is that the cable termination, while relatively insignificant at lower signaling frequencies such as 2.5 GHz or even 5 GHz, becomes more important at high signaling frequencies such as 10 GHz and above. Conventional termination between a cable and a circuit card (such as a paddle card) would include three pads on the circuit board, two for signals and one for a ground (assuming a differential signal configuration as is commonly used in higher frequency applications). Existing designs had the pads arranged in one of two basic configurations, a ground, signal, signal arrangement or a signal, ground, signal arrangement.

It has been determined that both known methods are problematic at higher frequencies. One reason for these problems is that the two conductors (which form a pair of conductive terminals and can be referred to as a differential pair) are spaced apart by the insulative layer and the two insulative conductors are positioned side by side inside an external layer that typically is a shield (to provide additional protection from spurious signals). Thus, there is an electromagnetic field that exists between the conductors acting in a differential mode as well as a field between the conductors and the shield that can be considered a common mode. While traveling along the cable these field shapes are maintained reasonably well, even around bends, such that there are minimal reflections or impedance discontinuities. However, when the cable is terminated to the circuit card the physical configuration is not maintained and the sudden change in physical configuration changes the shape of the fields and creates impedance changes between the various components of the cable, creating impedance discontinuities and the potential for significant reflections (which tends to increase insertion loss).

The above issue is further exacerbated by fact that in a normal termination the shield ends and the voltage reference plane is continued by a signal drain wire that is positioned on one side of the differential pair. Thus, the coupling between the conductors and the shield that extended in three hundred sixty degrees suddenly is focused along a single direction. This issue is further complicated by the fact that the drain wire that was between the two conductors but offset is then placed either on one side of the differential pair or directly between them. Thus the pad orientation of the circuit board further complicates the cable termination and creates additional signal integrity problems.

One method that has been considered to address this issue is to use two drain wires on opposite sides of the differential pair. While such a configuration does aid in providing greater symmetry in the termination, having two drain wires can cause issues during bends and thus may only provide minimal system level benefits. In addition, during termination the need to secure the two drain wires means additional space is required. Thus for certain applications the use of two drain wires is not desirable.

As can be appreciated from FIG. 1-5, an embodiment of a cable termination 20 is depicted that can help resolve the above issues and the Figs. illustrates an embodiment where a drain wire 56 is terminated into a ground via 35. More specifically, a cable 50 includes a first conductor 54 and a second conductor 55 (which collectively form a conductive pair) and each conductor is positioned in an insulative sleeve 57. A drain wire 56 is positioned along one side of the conductive pair and a cable shield 59 wraps the drain wire 56 and the first and second conductors 54, 55. It should be noted that it is preferred to have the drain wire 56 extend into the ground via 35 so as to help control and orientate the termination but it is sufficient from an electrical standpoint to have the drain wire 56 soldered to the ground via 35 without extending into the ground via 35.

A circuit board 30 includes a first trace 31 and a second trace 32 that together form a differential transmission line that can extend a predetermined distance along the circuit board 30. Each of the first and second traces 31, 32 include a pad 33 that is configured to be soldered to the respective conductors. A solder fillet 60 secures the conductors 54, 55 to the pads 33. As depicted, a first pad 33a includes a centerline 34a and a second pad 33b includes a centerline 34b. The centerlines 34a, 34b can be parallel to each other and a ground via 35 is positioned between the centerlines 34a, 34b. In an embodiment the ground via can be positioned so that a centerline 35a that crosses the ground via 35 and that is parallel to the centerlines 34a, 34b is equidistant to the centerlines 34a. 34b (e.g, is exactly halfway between the centerlines 34a, 34b). As can be appreciated, the circuit board 30 has an edge 30a and the ground via is positioned a first distance from the edge 30a. Each of the traces starts a position that is second distance from the edge 30a and the second distance is greater than the first distance. In an embodiment the second distance is at least 0.5 mm greater than the first distance so as to provide more desirable electrical performance.

While the termination depicted in FIGS. 1-5 would appear to be somewhat problematic from a symmetry standpoint, it has been determined somewhat surprisingly that such a termination configuration is superior to the conventional use of three pads. In addition, as can be appreciated, the position of the ground via on a centerline that extends between the two signal traces allows for a more compact termination arrangement. Such a construction is particularly helpful in embodiments where the connector pitch is going to be smaller than 0.8 mm. The depicted configuration, for example, works well with a connector intended to support a 0.5 mm pitch contact system.

It should be noted that while individual moldings caps 40, 41 are shown (one covering each termination pair), it is expected that in practice that a unitary molding cap can be used (e.g., a single molding can cover one or both sides of the circuit board and a portion of the cables) so as to provide good strain relief and to help ensure the conductors are securely attach to the circuit board. The use of a molding cap is optional, however, and is not intended to be limiting unless otherwise noted. In the event a molding cap is provided, a groove 42 in the molding cap can, if desired, be placed between the two conductors so as to improve the impedance of the termination region.

FIGS. 6-10 illustrate an embodiment of a termination 120. The cable 150 can be constructed in a manner similar to the cable 50 (with first and second conductors 154, 155, a drain wire 156 and a shield 159) and can be terminated to a circuit board 130 that has substantially the same construction as the circuit board 30. Thus the distance 138 between a ground via 135 and an end 131a of trace 131 preferably can be greater than 0.5 mm. The difference in the termination 120 is that the cable orientation is rotated 180 degrees so that the drain wire 156 extends above, rather than below, the first and second conductors 154, 155. Accordingly, the drain wire extends transversely between the conductors 154, 155 before being inserted into the ground via 135. While one would expect that this would cause problems with the electromagnetic fields, somewhat surprisingly it has been determined that having the drain wire 156 extending between the conductors 154, 155 before being electrically connected to the ground via 135 provides further improvements in managing the coupling between the conductors and the shield and further reduces impedance discontinuities compared to the embodiment depicted in FIGS. 1-5.

It should be noted that as depicted, cables may be terminated to both sides of the circuit card such that conductors are soldered to pads (which can be configured to have the same dimensions as the rest of the trace or have different dimensions if desired) on both sides of the circuit board. Such a construction is not required but is beneficial in providing a more compact termination configuration that is suitable for use in applications where it is desirable to have a compact connector.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

What is claimed is:

1. A cable termination, comprising:
a cable having an outer shield, a first conductor with an insulative cover, a second conductor with an insulative cover, and a drain wire positioned inside the outer shield and along side the first and second conductors; and
a circuit board with first edge, the circuit board having a first side with a first trace with a first pad and a second trace with a second pad, the first and second pads spaced apart, each of the pads having a centerline that extends toward the edge, wherein the circuit board further includes a ground via positioned between the centerlines of the first and second pads, the first conductor soldered to the first pad, the second conductor soldered to the second pad and the drain wire soldered to the ground via.

2. The cable termination of claim 1, wherein the drain wire extends transversely between the first and second conductors before being soldered to the ground via.

3. The cable termination of claim 1, wherein the drain wire extends into the ground via.

4. The cable termination of claim 1, wherein the circuit board is configured to support a connector having contacts on a 0.5 mm pitch.

5. The cable termination of claim 1, wherein the pads are positioned a first distance from the edge and the ground via is positioned so that a center of the ground via is a second distance from the edge and the first distance is at least 0.5 mm greater than the second distance.

6. The cable termination of claim 1, further comprising a molding cap provided on the circuit board, the molding cap configured to help protect and maintain the connection between the conductors and the circuit board.

7. The cable terminal of claim 6, wherein the molding cap has a groove between the solder connections of the first and second conductors.

8. The cable termination of claim 1, wherein the circuit board has a second side with a third trace and a fourth trace and another ground via, the third trace having a third pad and the fourth trace having a fourth pad and the termination further comprising a second cable with a third conductor, a fourth conductor, another shield and another drain wire, the third conductor soldered to the third pad, the fourth conductor terminated to the fourth pad and the other drain wire positioned in and soldered to the other terminated to a second side of the circuit with a first trace with a first pad and a second trace with a second pad.

9. The cable termination of claim 8, wherein the molding cap covers the first and second sides of the circuit board and is configured to protect the solder connections on both sides of the circuit board.

10. The cable termination of claim 1, wherein the centerlines of the first and second pads are parallel and a centerline that is equidistance from and parallel to the centerlines of the first and second pads crosses the ground via.

* * * * *